(12) United States Patent
Kwon et al.

(10) Patent No.: US 9,035,396 B2
(45) Date of Patent: May 19, 2015

(54) SEMICONDUCTOR DEVICE INCLUDING DUMMY GATE PART AND METHOD OF FABRICATING THE SAME

(75) Inventors: Byoung-ho Kwon, Hwaseong-si (KR); Sang-youn Jo, Suwon-si (KR); Jin-sook Choi, Suwon-si (KR); Chang-ki Hong, Seongnam-si (KR); Bo-un Yoon, Seoul (KR); Hong-soo Kim, Yongin-si (KR); Se-rah Yun, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 169 days.

(21) Appl. No.: 13/240,475

(22) Filed: Sep. 22, 2011

(65) Prior Publication Data

US 2012/0028435 A1 Feb. 2, 2012

Related U.S. Application Data

(62) Division of application No. 12/291,211, filed on Nov. 7, 2008, now Pat. No. 8,053,845.

(30) Foreign Application Priority Data

Nov. 8, 2007 (KR) .......................... 10-2007-0113719

(51) Int. Cl.
*H01L 27/14* (2006.01)
*H01L 29/76* (2006.01)
(Continued)

(52) U.S. Cl.
CPC ........ *H01L 21/31053* (2013.01); *H01L 27/105* (2013.01); *H01L 29/66545* (2013.01); *H01L 27/1052* (2013.01)

(58) Field of Classification Search
USPC .......... 438/400, 404, 405, 587, 626; 257/390, 257/368, 288, 775, 773, 389, 365, 367, 350, 257/409, 407, E27.07, E21.54
See application file for complete search history.

(56) References Cited

U.S. PATENT DOCUMENTS 6,020,616 A * 2/2000 Bothra et al. .................. 257/381
6,232,161 B1 * 5/2001 Chen et al. ..................... 438/199
(Continued)

FOREIGN PATENT DOCUMENTS

KR 10-0207519 4/1999
KR 10-0207519 7/1999
(Continued)

OTHER PUBLICATIONS

Office Action issued by the Korean Patent Office on Dec. 10, 2012.
(Continued)

*Primary Examiner* — Ori Nadav
(74) *Attorney, Agent, or Firm* — Muir Patent Law, PLLC

(57) ABSTRACT

In a reliable semiconductor device and a method of fabricating the semiconductor device, a difference in height between upper surfaces of a cell region and a peripheral region (also referred to as a level difference) is minimized by optimizing dummy gate parts. The semiconductor device includes a semiconductor substrate including a cell region and a peripheral region surrounding the cell region, a plurality of dummy active regions surrounded by a device isolating region and formed apart from each other, and a plurality of dummy gate parts formed on the dummy active regions and on the device isolating regions located between the dummy active regions, wherein each of the dummy gate parts covers two or more of the dummy active regions.

32 Claims, 5 Drawing Sheets

(51) Int. Cl.
*H01L 21/3105* (2006.01)
*H01L 27/105* (2006.01)
*H01L 29/66* (2006.01)

(56) References Cited

U.S. PATENT DOCUMENTS

| | | | |
|---|---|---|---|
| 6,255,697 B1 * | 7/2001 | Yoo et al. | 257/365 |
| 6,365,928 B1 * | 4/2002 | Yang et al. | 257/296 |
| 6,603,162 B1 * | 8/2003 | Uchiyama et al. | 257/296 |
| 7,685,551 B2 * | 3/2010 | Toubou et al. | 716/119 |
| 2004/0173904 A1 * | 9/2004 | Cleeves et al. | 257/738 |
| 2005/0285204 A1 * | 12/2005 | Kim et al. | 257/368 |
| 2006/0128082 A1 * | 6/2006 | Chuang et al. | 438/183 |
| 2006/0255394 A1 | 11/2006 | Park | |
| 2007/0117321 A1 | 5/2007 | Park | |

FOREIGN PATENT DOCUMENTS

| | | |
|---|---|---|
| KR | 1020010038611 | 5/2001 |
| KR | 20020036384 | 5/2002 |
| KR | 100632655 | 9/2006 |

OTHER PUBLICATIONS

"Semiconductor Device Including Dummy Gate Part and Method of Fabricating the Same" Specification, Drawings, claims and Prosecution History, of U.S. Appl. No. 12/291,211, filed Nov. 7, 2008, by inventor(s), which is stored in the U.S. Patent and Trademark Office (USPTO).

* cited by examiner

SEMICONDUCTOR DEVICE INCLUDING DUMMY GATE PART AND METHOD OF FABRICATING THE SAME

CROSS-REFERENCE TO RELATED PATENT APPLICATION

This application is a divisional application of U.S. patent application Ser. No. 12/291,211 filed on Nov. 7, 2008, which claims the benefit of Korean Patent Application No. 10-2007-0113719, filed on Nov. 8, 2007, in the Korean Intellectual Property Office, the contents of which are incorporated herein in their entirety by reference.

BACKGROUND OF THE INVENTION

1. Field of the Invention

The present invention relates to a semiconductor device, and more particularly, to a semiconductor device, in which a dummy gate part is formed in a peripheral region, and a method of fabricating the same.

2. Description of the Related Art

As semiconductor devices continue to be more densely integrated, individual circuit patterns are becoming more densely arranged to attempt to include more semiconductor devices within the same area. The high density of circuit patterns causes various problems during manufacturing of semiconductor devices, and thus new methods of manufacturing semiconductor devices are being developed.

Generally, in the manufacture of a semiconductor device, a gate pattern is formed on a semiconductor substrate, an interlayer insulation layer is formed on the gate pattern, and a circuit layer is formed on the interlayer insulation layer. To form the circuit layer on an even interlayer insulation layer, chemical mechanical polishing (CMP) is performed on the interlayer insulation layer after the interlayer insulation layer is formed. However, due to the formation of gate patterns in a cell region, the interlayer insulation layer will not be level with a peripheral region even after CMP. If a pattern corresponding to the circuit pattern is formed on the interlayer insulation layer, it may cause a defective pattern due to the lack of a defocus margin.

Therefore, a dummy gate part is formed in the peripheral region, which corresponds to a real gate parts in the cell region, to prevent the aforementioned problem.

FIGS. 1 through 3 are sectional views illustrating a manufacturing process of a semiconductor device having a dummy gate part of the prior art.

Referring to FIG. 1, the top surface of a semiconductor device 10 is divided into two regions: a cell region C having formed thereon semiconductor memory devices and a peripheral region P formed around the cell region C and having formed thereon some control devices and dummy devices. In the cell region C, a real active region 11a is formed, surrounded and defined by a device isolating region 12. Also, a plurality of dummy active regions 11c, surrounded and defined by the device isolating region 12, and some real active regions 11b are formed. Also, a plurality of real gate parts 14a, which form semiconductor devices, are formed on the semiconductor substrate 10 in the cell region C by having a gate insulation layer (not shown) therebetween. A plurality of dummy gate parts 14c are also formed on the semiconductor substrate 10 in the peripheral region P by having a gate insulation layer (not shown) there-between. As needed, some real gate parts 14b may also be formed on the semiconductor substrate 10 in the peripheral region P.

The dummy gate parts 14c formed in the peripheral region P are formed in correspondence to the real gate parts 14a only to decrease a difference in height between upper surfaces of the cell region C and the peripheral region P (herein referred to as "a level difference"), and are insulated from surrounding conductive layers by a insulating material layer. Also, each of the dummy gate parts 14c is formed on each of the dummy active regions 11c, respectively. When impurity ions are implanted to the real active region 11a in the cell region C, the impurity ions may also be undesirably implanted to the dummy active regions 11c in the peripheral region P, and thus the dummy gate parts 14c are formed so that each dummy gate part 14c covers a corresponding dummy active region 11c.

Referring to FIG. 2, a thick interlayer insulation layer 16 is formed on the semiconductor substrate 10, on which the real gate parts 14a and the dummy gate parts 14c are formed. While the interlayer insulation layer 16 in the cell region C is evenly formed due to high density of the real gate parts 14a, the interlayer insulation layer 16 in the peripheral region P is formed unevenly because relatively more of the material forming the interlayer insulation layer fills spaces between the dummy gate parts 14c, formed at a density lower than that of the real gate parts 14a. Thus, there may be many sunken parts on the surface of the interlayer insulation layer 16 in the peripheral region P.

Referring to FIG. 3, CMP is performed on the interlayer insulation layer 16 to form an even top surface. Since the density of the real gate parts 14a in the cell region C is larger than the density of the dummy gate parts 14c in the peripheral region P, a level difference t at right side is created.

Therefore, a circuit layer or another interlayer insulation layer (not shown), which is to be formed on the interlayer insulation layer, cannot be formed evenly due to the level difference t between the cell region C and the peripheral region P, and thus the unevenness may cause a defective pattern in the formation of circuit patterns.

SUMMARY OF THE INVENTION

The present invention provides a semiconductor device, in which a difference in height between upper surfaces of a cell region and a peripheral region (herein referred to as level difference) can be decreased by forming dummy gate parts in the peripheral region, and a method of fabricating the semiconductor device, to resolve problems which occur in the prior art.

The present invention also provides a reliable semiconductor device, in which the level difference between a cell region and a peripheral region is minimized by optimizing dummy gate parts, and a method of fabricating the semiconductor device.

According to an aspect of the present invention, there is provided a semiconductor device including a semiconductor substrate comprising a cell region and a peripheral region surrounding the cell region, a plurality of dummy active regions surrounded by a device isolating region in the peripheral region and formed apart from each other, and at least one dummy gate part which is formed on the device isolating region on the dummy active regions formed adjacent to each other and covers two or more of the dummy active regions.

In one embodiment, real gate parts are formed in the cell region in correspondence to the dummy gate part in the peripheral region, and the real gate parts and the dummy gate part may be formed of the same material. The dummy active regions may be covered by the dummy gate part so that the dummy active regions are not exposed outside the dummy gate part.

The dummy active regions may have a rectangular pattern, and the dummy gate parts may have a stripe pattern in correspondence to the dummy active regions. Alternatively, the dummy active regions may have a pattern of a plurality of islands, and the dummy gate part may have a rectangular panel shape covering the dummy active regions in the island shapes.

At least one real active region and at least one real gate part in correspondence to the real active region may further be formed in the peripheral region. Alternatively, at least a dummy active region and at least a dummy gate part in correspondence to the dummy active region may be formed in the cell region.

According to another aspect of the present invention, there is provided a method of fabricating a semiconductor device, the method including providing a semiconductor substrate, forming a cell region and a peripheral region surrounding the cell region, both of which are defined by device isolating region, and forming a plurality of dummy active regions in the peripheral region, the dummy active regions being surrounded by the device isolating region and being formed apart from each other, forming a gate part forming material layer over the semiconductor substrate, forming from the gate part forming material layer a plurality of real gate parts in the cell region and forming from the gate part forming material layer dummy gate parts on the device isolating region on the dummy active regions in the peripheral region, each of the dummy gate parts covering two or more of the dummy active regions, forming an interlayer insulation layer over the semiconductor substrate, and flattening the surface of the interlayer insulation layer.

The method may further include implanting impurity ions to the semiconductor substrate after forming the real gate parts and the dummy gate parts, wherein the dummy gate parts may function as an ion-implanting mask such that the impurity ions are not implanted to the dummy active regions.

In one embodiment, the dummy active regions are formed to have a linear pattern, and the dummy gate parts are formed to have a linear pattern in correspondence to the dummy active regions.

In one embodiment, the dummy active regions are formed to have a pattern of a plurality of islands in a matrix, and the dummy gate parts are formed to have a rectangular panel shape covering the dummy active regions in the island pattern.

In one embodiment, the method further comprises: forming real active regions in the peripheral region; and forming real gate parts in correspondence to the real active regions, in the peripheral region.

In one embodiment, the method further comprises: forming dummy active regions in the cell region; and forming dummy gate parts in correspondence to the dummy active regions, in the cell region.

In one embodiment, the flattening of the interlayer insulation layer is performed using a CMP (chemical mechanical polishing) method.

The overall surface area of the dummy gate parts may be controlled to decrease density difference between the real gate parts in the cell region and the dummy gate parts in the peripheral region.

According to the present invention, the density of dummy gate parts can be controlled freely as occasion demands when the density of dummy active region is optimized, and thus the level difference between certain material layers on a semiconductor substrate can be decreased.

According to the present invention, the density of dummy active regions can be maintained within proper range without concerning the controlling density of dummy gate parts, and thus a shallow trench isolation (STI) operation can be performed smoothly.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Figure 1:
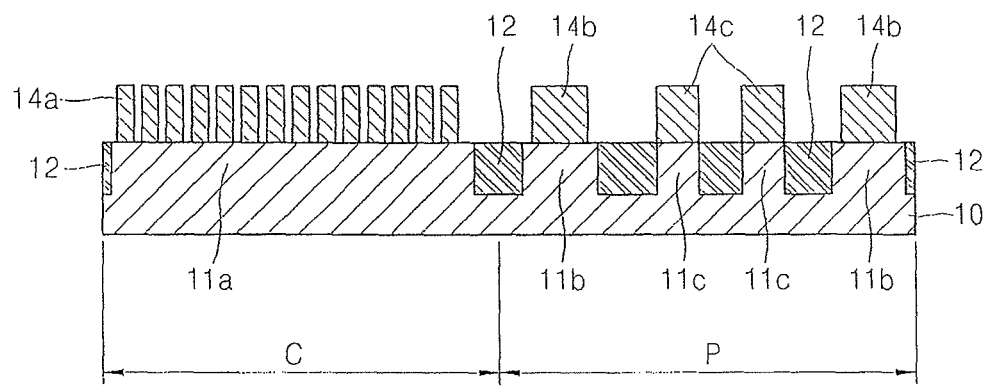
FIGS. 1 through 3 are sectional views illustrating a process for manufacturing a semiconductor device having a dummy gate part in the prior art.
Figure 2:
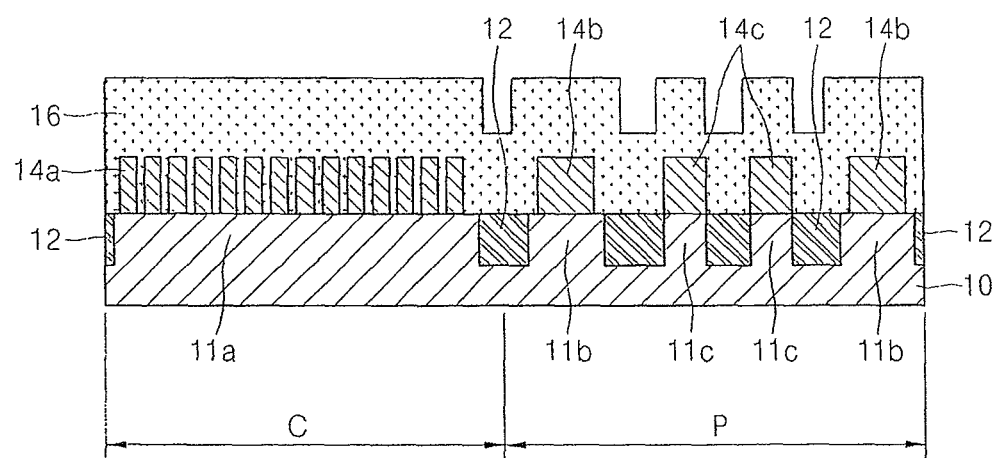
Figure 3:
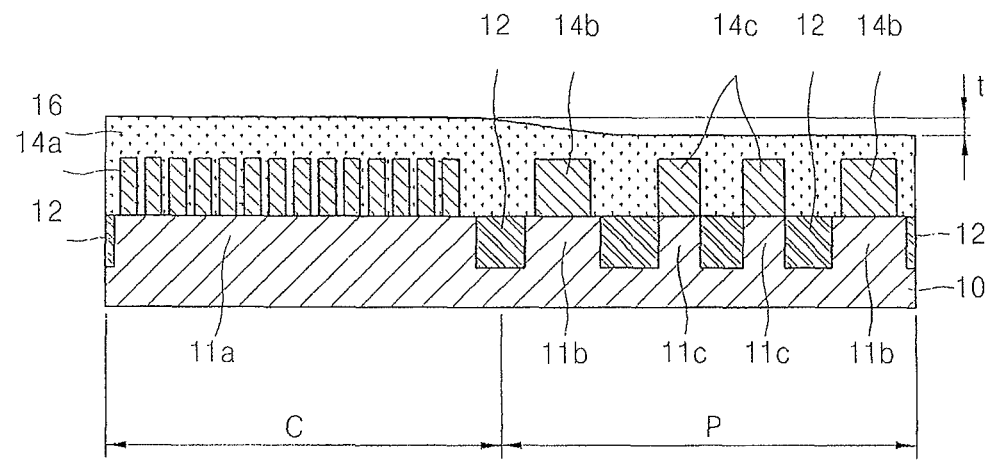
Figure 4:
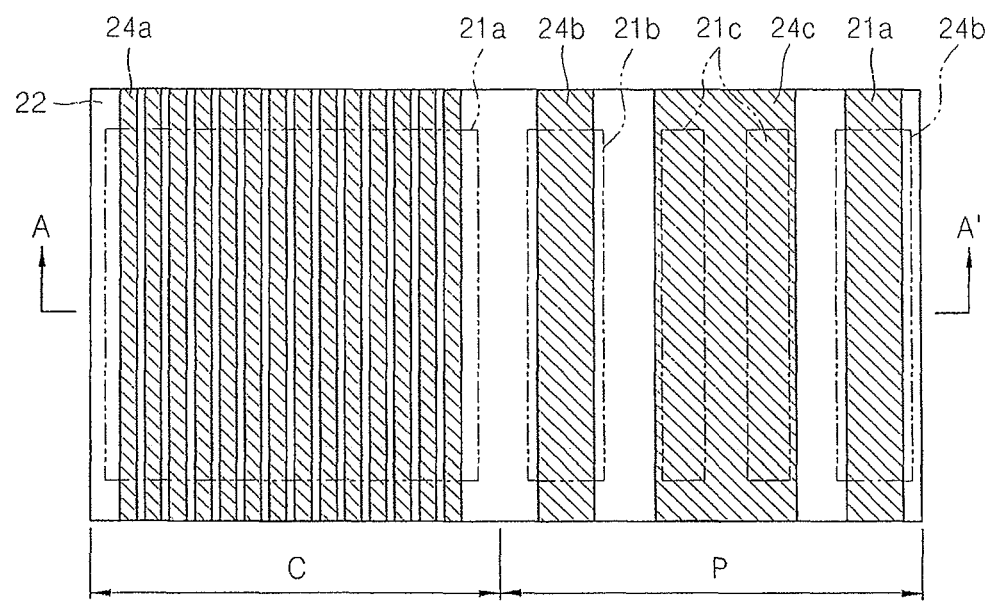
FIG. 4 is a plan view of a semiconductor device according to an embodiment of the present invention.
Figure 5:
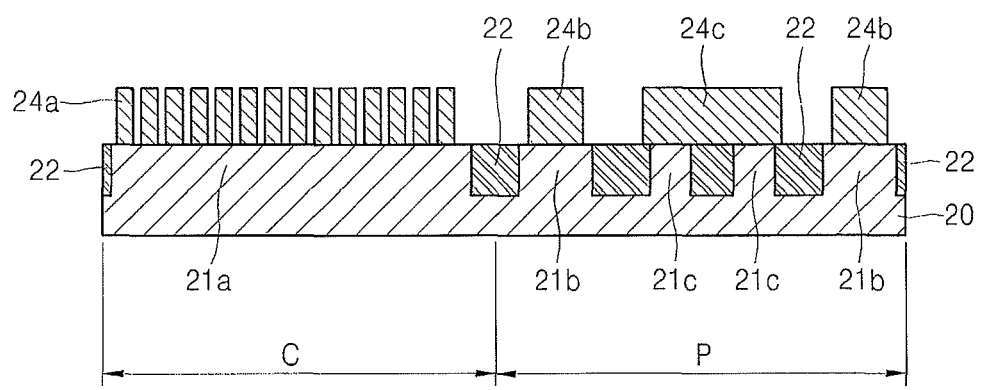
FIGS. 5 through 7 are sectional views illustrating a process for manufacturing the semiconductor device, taken along line A-A' of FIG. 4.
Figure 6:
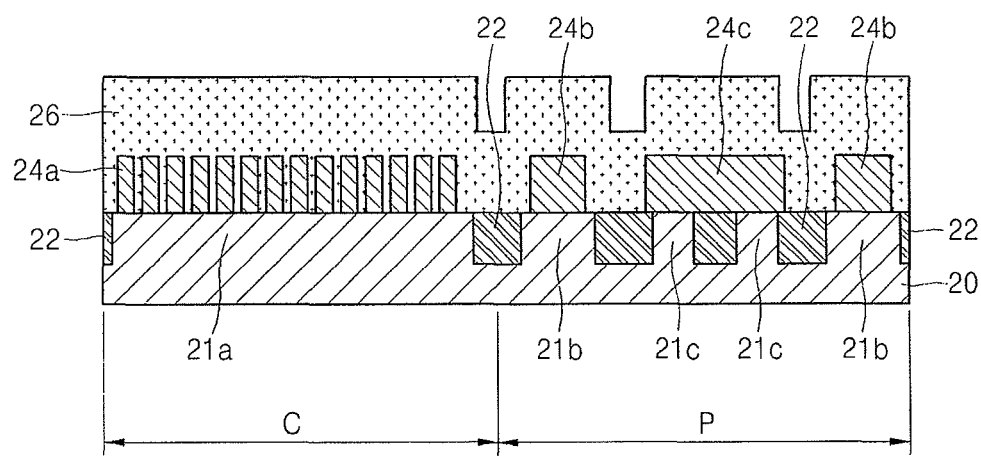
Figure 7:
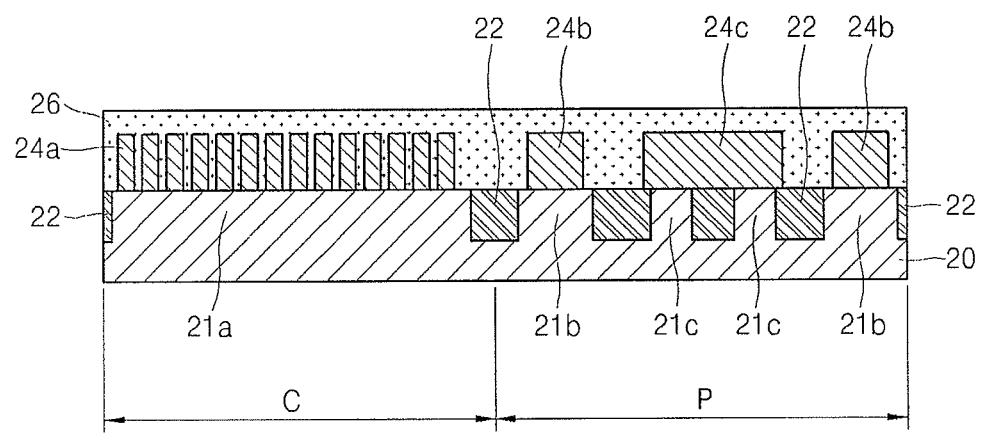

FIG. 4 is a plan view of a semiconductor device according to an embodiment of the present invention, and FIGS. 5 through 7 are sectional views illustrating a process FOR manufacturing the semiconductor device, taken along line A-A' of FIG. 4.

Referring to FIGS. 4 and 5, the top surface of a semiconductor substrate 20, which is, for example, formed of a silicon single crystal, is divided into two regions: a cell region C, on which semiconductor memory devices will be formed, and a peripheral region P, which is formed around the cell region C and on which some control devices and dummy devices will be formed. A real active region 21a, surrounded and defined by a device isolating region 22, is formed in the cell region C. A plurality of dummy active regions 21c, surrounded and defined by the device isolating region 22, are formed in the peripheral region P. Real active regions 21b are also formed in the peripheral region P. When the peripheral region P is formed as a single device isolating region without forming the plurality of dummy active regions 21c, chemical mechanical polishing cannot be performed smoothly due to a relatively large device isolating region when shallow trench isolation (STI) is applied in the peripheral region P, and thus a plurality of the dummy gates 21c, which have no relevance to circuit operations, are formed in the peripheral region P. Semiconductor devices such as a control device carrying out circuit operations, which is, for example, a transistor, may also be located in a certain area of the peripheral region P, and a plurality of real gate parts 24b can also be formed on the real active region 21b of the peripheral region P by having a gate insulation layer (not shown) therebetween.

As shown in FIG. 4, the dummy active regions 21c formed in the peripheral region P extend linearly in the present embodiment. The device isolating region 22 is formed by forming a mask pattern defining the device isolating region 22 on the top surface of the semiconductor substrate 20, forming a trench by etching a portion of the semiconductor substrate 20 by using the mask pattern as an etch mask, and filling the trench with insulating materials, such as an oxide and/or a nitride, through a gap filling operation. After the device isolating region 22 is formed, a gate insulation layer (not shown) is formed over the semiconductor substrate 20, a gate part forming material is formed to a predetermined thickness, and a gate part pattern is formed through a lithography operation.

As shown in FIGS. 4 and 5, the real gate parts 24a are densely formed on the real active regions 21a in the shape of line/space pattern in the cell region C. In the peripheral region P, the dummy gate parts 24c are formed on the dummy active region 21c having a linear shape in a stripe pattern. Each of the dummy gate parts 24c covers two of the dummy active regions 21c in the present embodiment. However, the present invention is not limited to that configuration, and each of the dummy gate parts 24c can cover two or more dummy active regions 21c. For example, n dummy active regions and (n−1) device isolating regions between the dummy active regions can be either bundled by using one of the dummy gate parts or bundled by a plurality of the dummy gate parts. As the single dummy gate part covers a plurality of the dummy active regions 21c and device isolating regions 22, density of the dummy gate parts 24c in an overall area of the peripheral region P can be increased.

While only one dummy gate part 24c is shown in FIGS. 4 and 5 for simplicity of description, a plurality of the dummy gate parts 24c may be formed adjacent to each other. After the real gate parts 24a and 24b and the dummy gate parts 24c are formed, ions are implanted to expose a portion of the semiconductor substrate 20 by using the real gate parts 24a and 24b and the dummy gate parts 24c as an ion-implanting mask. Therefore, it may be preferable for each of the dummy gate parts 24c to completely cover the dummy active regions 21c below the dummy gate part 24c to prevent the dummy active regions 21c from becoming conductive due to ions being implanted into the dummy active regions 21 in a subsequent ion-implanting operation.

The number of dummy active regions corresponding to the number of dummy gate parts is increased to increase the area occupied by the dummy gate parts 24c in the peripheral area P, that is, to increase the density of the dummy gate parts 24c, because each of the dummy gate parts 24c corresponds to one of the dummy active regions 21c in a semiconductor device having a dummy gate in the prior art. While either each of the dummy active regions, or the device isolating region 22 surrounding each of the dummy active regions 21c needs to be minimized to increase the number of the dummy active regions 21 within the device isolating region having a limited area in the peripheral region P, there is a limit in making the patterns for the dummy active regions and the device isolating regions finer.

Also, the area of the device isolating region 22 between the dummy active regions 21c become smaller as the number and area of the dummy active regions 21c increase. Furthermore, it becomes less suitable for performing STI to form the device isolating region 22. However, since the dummy active regions 21c and the dummy gate parts 24c do not correspond to each other in a one-to-one basis, the density of the dummy active regions 21c and the density of the dummy gate parts 24c can be optimized separately. Therefore, after the dummy active regions 21c are formed in the density optimal for performing STI smoothly, the dummy gate parts 24c can be formed in any density concerning the density of the real gate parts 24a in the cell region C, where it is not necessary to concern the density of the dummy active regions 21c. The term 'density' here refers to a ratio of an area occupied by a certain component to the entire surface area. For example, the density of the real gate parts 24a in the cell region C refers to the ratio of the area occupied by the real gate parts 24a in the cell region C to the entire surface area of the cell region C.

Referring to FIG. 6, a thick interlayer insulation layer 26 is formed over the real gate parts 24a and the dummy gate parts 24c on the semiconductor substrate, wherein the interlayer insulation layer 26 may be formed of, for example, an oxide or a nitride. At this point, the interlayer insulation layer 26 in the cell region C is formed evenly due to the densely concentrated real gate parts 24a. Since the dummy gate parts 24c have a sufficient density, less of the material forming the interlayer insulation layer fills spaces between the dummy gate parts 24c, and thus the interlayer insulation layer 26 in the peripheral region P can also be formed evenly.

Referring to FIG. 7, CMP is performed on the interlayer insulation layer 26 to even the surface of the interlayer insulation layer 26. Since the density of the real gate parts 24a in the cell region C is not significantly different from the density of the dummy gate parts 24c in the peripheral region P, the volumes of slurries used for the CMP are nearly same in both regions C and P, and thus the loading effect can be prevented. Also, there is little level difference between the cell region C and the peripheral region P, and thus the evenness of entire surface is significantly improved.

Therefore, a circuit layer or other interlayer insulation layer (not shown), which is to be formed later, can be formed to be flat with little level difference between the cell region C and the peripheral region P, and thus the formation of circuit patterns on the layers can be performed successfully.

Figure 8:
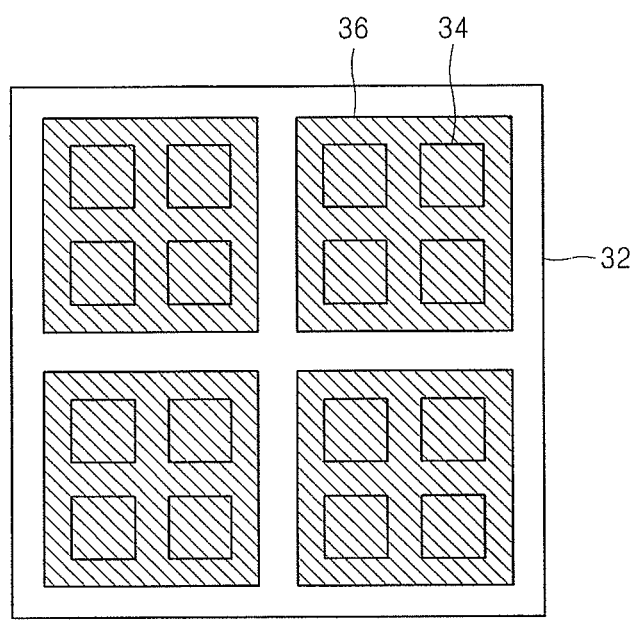
FIG. 8 is a plan view showing a positional relationship between dummy active regions and dummy gate parts in a peripheral region of a semiconductor device according to another embodiment of the present invention.

FIG. 8 is a plan view showing a positional relationship between dummy active regions 34 and dummy gate parts 36 in a peripheral region of a semiconductor device according to another embodiment of the present invention.

Referring to FIG. 8, while the dummy active regions 21c, surrounded by the device isolating region 22, are formed to extend linearly in the semiconductor device shown in FIG. 4, the dummy active regions 34 in the semiconductor device of the present embodiment are formed in island shapes by a device isolating region 32, and a plurality of the dummy active regions 34 are formed in matrix shape in the peripheral region. As described in the previous embodiment, the density of the dummy active regions 34 may be set to an optimal density for smoothly performing STI to isolate devices in the peripheral region. Thus, the STI can be performed smoothly without minimizing either size of the dummy active regions 34 or width of the device isolating region 36 between the dummy active regions 34.

The dummy active regions 34 arranged in matrix shape can be bundled by dummy gate parts 36 having appropriate sizes. Although a case in which four dummy active regions 34 are bundled by one dummy gate part 36 is shown in FIG. 8, the present invention is not limited thereto. The dummy gate parts 36 can be arranged in various combinations as long as each dummy gate part 36 can cover any number of the dummy active regions 34 and the number of the dummy active regions 34 is two or more. Also, it is advantageous that the dummy gate parts 36 are formed to have a specific size and arrangement such that a difference between the density of real gate parts in the cell region and the density of the dummy gate parts 36 is within a permissible range and is as small as possible to ensure surface evenness of an interlayer insulation layer, which is to be formed later, after performing CMP on the interlayer insulation layer.

Figure 9:
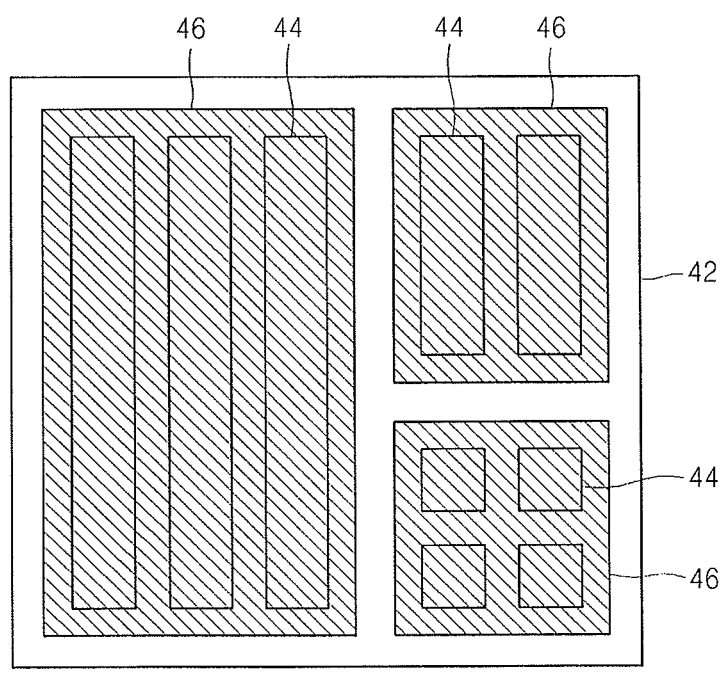
FIG. 9 is a plan view showing a positional relationship between dummy active regions and dummy gate parts in a peripheral region of a semiconductor device according to another embodiment of the present invention.

FIG. 9 is a plan view showing a positional relationship between dummy active regions 44 and dummy gate parts 46 in a peripheral region of a semiconductor device according to another embodiment of the present invention.

Referring to FIG. 9, the dummy active regions 44, defined by a device isolating region 42, are arranged in a line and island pattern, and the dummy gate parts 46 are arranged in various patterns in correspondence to the pattern of the dummy active regions 44.

While the embodiments of the present invention have been particularly shown and described, the invention may, however, be embodied in many different forms and should not be construed as being limited to the embodiments set forth herein. For example, the embodiments of the present invention have been described under an assumption that density of real gate parts in a cell region of a semiconductor device is greater than density of dummy gate parts in a peripheral region of the semiconductor device. However, when density of real gate parts in cell region of a semiconductor device is smaller than density of dummy gate parts in peripheral region of the semiconductor device, dummy gate parts can be further formed in the cell region to minimize density difference between the gate parts of both of the regions, and the dummy gate parts can be formed in various sizes and shapes in correspondence to dummy active regions, which may be formed in the cell region.

Furthermore, dummy active regions formed in a peripheral region of a semiconductor substrate and dummy gate parts formed on the dummy active regions are described in the embodiments of the present invention. However, if CMP is performed on a material layer within stacked layers of a semiconductor device as may be required, it is clear that dummy gate parts can be formed in a cell region and/or the peripheral region in various sizes and shapes according to the present invention prior to the CMP operation.

What is claimed is:

1. A method of manufacturing a semiconductor device comprising:
    providing a semiconductor substrate;
    forming a cell region and a peripheral region adjacent to the cell region, the cell comprising:
        a first real active region; and
        a plurality of first real gate lines over the first real active region, each of the first real gate lines extending in a first direction;
    the peripheral region comprising:
        a second real active region;
        a second real gate line extending over the second real active region in the first direction;
        a third real active region;
        a third real gate line extending over the third real active region in the first direction,
        first and second dummy active regions;
        a gate insulator on the semiconductor substrate including on the first and second dummy active regions; and
        a dummy gate line extending in the first direction on the gate insulator and located over the first and second dummy active regions,
    wherein each of the first, second and third real active regions and the first and second dummy active regions is formed in the semiconductor substrate,
    wherein each of the first, second and third real active regions and the first and second dummy active regions has a boundary defined by and ending at device isolation insulating material formed in corresponding one or more openings in the semiconductor substrate,
    wherein, with respect to a first cross section of the semiconductor device perpendicular to the first direction:
        a first, second and third device isolation insulating materials, respectively formed in first, second and third openings in the semiconductor substrate, extends from an edge of the first dummy active region to an edge of the second dummy active region,
        the dummy gate line is located above the first dummy active region and the second dummy active region, and
        the dummy gate line is located above and fully covers the entire first device isolation insulating material,
    wherein the first, second and third real gate lines and the dummy gate line are formed by patterning a gate part forming layer formed over the gate insulating layer, and
    wherein the dummy gate line formed from such patterning fully covers, with respect to the first cross section, the entire first and second dummy active regions and vertical edges of the dummy gate line are respectively formed directly over the second and third isolation insulating materials.

2. The method of claim 1, further comprising forming a third dummy active region in the peripheral region, and wherein with respect to the first cross section, the dummy gate line is formed to cover the third dummy active region.

3. The method of claim 1, wherein, with respect to a top down view, the device isolation insulating material formed in one or more openings in the semiconductor substrate defines the first dummy active region and the second dummy active region as separate, unconnected regions.

4. The method of claim 1, wherein, after completion of manufacturing the semiconductor device, the first and second dummy active regions are not electrically connected to any circuitry of the semiconductor device.

5. The method of claim 1, wherein, after completion of manufacturing the semiconductor device, no real gate line extends over the first or second dummy active regions.

6. The method of claim 1, wherein the first and second dummy active regions do not comprise conductive material.

7. The method of claim 1, further comprising:
    forming a plurality of third dummy active regions in the peripheral region arranged in matrix form in the peripheral region, the device isolation insulating material formed in one or more openings in the semiconductor substrate defining, with respect to a top down view, each of the third active regions as separate, unconnected regions; and
    forming a dummy gate part fully covering the entirety of third dummy active regions.

8. The method of claim 7, wherein each of the third dummy active regions, with respect to a top down view, has a height substantially equal to a width.

9. The method of claim 8, further comprising:
    forming fourth and fifth dummy active regions in the semiconductor substrate by defining the fourth and fifth dummy active regions with the device isolation insulating material formed in one or more openings in the semiconductor substrate, including a fourth device isolation insulating material located in a fourth opening in the semiconductor substrate between the fourth and fifth dummy active regions; and
    forming a second dummy gate line extending in the first direction and located over the fourth and fifth dummy active regions, and located over and completely covering the fourth device isolation insulating material located in the fourth opening in the semiconductor substrate between the fourth and fifth dummy active regions, wherein the second dummy gate line is shorter than the first dummy gate line.

10. The method of claim 9, wherein, with respect to the top down view, the first, second, fourth and fifth dummy active regions each are linear in shape and extend in the first direction.

11. The method of claim 1, further comprising:

forming third and fourth dummy active regions in the semiconductor substrate by defining the third and fourth dummy active regions with the device isolation insulating material formed in one or more openings in the semiconductor substrate, including, with respect to the first cross section, a fourth device isolation insulating material located in a fourth opening in the semiconductor substrate between the fourth and fifth dummy active regions; and forming a second dummy gate line extending in the first direction and located over the third and fourth dummy active regions, and located over and completely covering the fourth device isolation insulating material located in the fourth opening in the semiconductor substrate between the third and fourth dummy active regions, wherein the second dummy gate line is shorter than the first dummy gate line.

12. A method of manufacturing a semiconductor device, comprising:

providing a semiconductor substrate;

forming one or more openings in the semiconductor substrate, including, with respect to a first cross section, first, second and third openings;

forming device isolation insulating material in the one or more openings in the semiconductor substrate, the device isolation insulating material including first, second and third device isolation insulating material respectively in the first, second and third openings, a plurality of active regions defined in the semiconductor substrate between the device isolation insulating material, each active region, as viewed from a top down view, having a boundary defined by and ending at edges of the device isolation insulating material so as to be unconnected and separated from each other active region, the plurality of active regions comprising real active regions and dummy active regions, the dummy active regions comprising first and second dummy active regions, the first device isolation insulating material in the first opening being located between the first and second dummy active regions;

forming a gate insulator on the substrate including on the first and second dummy active regions;

forming a real gate line over a real active region of the plurality of active regions; and forming a first dummy gate line on the gate insulator over the first and second dummy active region, and over and fully covering the entire first device isolation insulating material in the first opening and fully covering entire the first and second dummy active regions, and wherein the real gate line and the first dummy gate line are formed by patterning a first conductive layer formed on the gate insulator, and wherein the first dummy gate line formed from such patterning fully covers the entire first and second dummy active regions and vertical edges of the first dummy gate line are respectively formed directly over the second and third device isolation insulating material.

13. The method of claim 12, wherein, after completion of manufacturing the semiconductor device, no conductive elements formed on the semiconductor substrate contact either of the first and second dummy active regions.

14. The method of claim 12, wherein the plurality of active regions comprises a third dummy active region and the first dummy gate line is formed to cover the third dummy active region.

15. The method of claim 12, wherein, after completion of manufacturing the semiconductor device, no real gate line extends over the first or second dummy active regions.

16. The method of claim 12, wherein the first and second dummy active regions do not comprise conductive material.

17. The method of claim 12, wherein the dummy active regions comprise a plurality of third dummy active regions arranged in matrix form, and wherein the method further comprises forming a dummy gate part over and fully covering the entirety of plurality of third dummy active regions.

18. The method of claim 17, wherein each of the third dummy active regions, with respect to a top down view, has a height substantially equal to a width.

19. The method of claim 18, wherein the first gate line extends in a first direction, wherein the dummy active regions comprise fourth and fifth active regions, each having a linear shape extending in the first direction, and the method further comprises forming a second dummy gate line over and fully covering the entire fourth and fifth active regions, the second dummy gate line extending in the first direction.

20. The method of claim 19, wherein the second dummy gate line is shorter than the first dummy gate line.

21. The method of claim 12, wherein the first gate line extends in a first direction, wherein the dummy active regions comprise third and fourth active regions, and the method further comprises forming a second dummy gate line over and fully covering the entire third and fourth active regions, the second dummy gate line extending in the first direction.

22. The method of claim 21, wherein the second dummy gate line is shorter than the first dummy gate line.

23. A method of manufacturing a semiconductor device, comprising:

forming device isolation material in device isolation region openings in a semiconductor substrate, forming a gate insulating layer over the semiconductor substrate;

forming a gate part forming layer over the gate insulating layer; and patterning the gate part forming layer to form a real gate line extending in a first direction and a first dummy gate line extending in the first direction, wherein, with respect to a cross section of the semiconductor device perpendicular to the first direction:

the device isolation region openings in the semiconductor substrate comprise first, second, third, fourth and fifth device isolation region openings, a first real active region is interposed between and extends to edges of the first and second device isolation region openings, a first dummy active region is interposed between and extends to opposing edges of the third and fourth device isolation region openings, a second dummy active region is interposed between and extends to opposing edges of the fourth and fifth isolation region openings, the real gate line is located above the first real active region, and the first dummy gate line is located above the first dummy active region, the fourth isolation region opening and the second dummy active region, wherein, with respect to a cross section of the semiconductor device perpendicular to the first direction, a width of the first dummy gate line is formed to extend from a first location over the third isolation region opening to a second location over the fifth isolation region opening, wherein the first dummy gate line fully covers, with respect to the cross section, the entire first and second dummy active regions and vertical edges of the dummy gate line are respectively formed directly over the third and fifth isolation region openings.

24. The method of claim 23, wherein, with respect to a top down view of the semiconductor device, the first dummy gate line is formed to fully cover the entire first dummy active region and the second dummy active region.

25. The method of claim 24, wherein the second and third dummy active regions are formed to have a linear shape that extends in the first direction.

26. The method of claim 25, wherein the third, fourth and fifth device isolation openings are formed as part of a same larger device isolation opening with respect to the top down view.

27. The method of claim 25, further comprising forming a plurality of third dummy active regions extending between edges of the one or more device isolation region openings, each of the third dummy active regions, with respect to a top down view of the semiconductor device, having a height in the first direction and a width in a second direction, perpendicular to the first direction, the height being substantially equal to the width.

28. The method of claim 27, wherein patterning the gate part forming layer comprises forming a dummy gate part from the gate part forming layer, the dummy gate part completely covering plural ones of the third dummy active regions.

29. The method of claim 28, wherein the third dummy active regions are arranged in a matrix.

30. The method of claim 29, wherein the third dummy active regions are arranged in a matrix having a size of m×n, where m is an integer equal to at least 2 and n is an integer equal to at least 2, and wherein the dummy gate part completely covers at least four of the dummy active regions.

31. The method of claim 29, further comprising:

forming a fourth dummy active region and a fifth dummy active region extending between edges of the one or more device isolation region openings, the fourth and fifth dummy active regions each having a linear shape that extends in the first direction, wherein patterning the gate part forming layer comprises forming a second dummy gate line from the gate part forming layer extending in the first direction, the second dummy gate line being formed to completely cover the fourth dummy active region and the fifth dummy active region, wherein the second dummy gate line has a length shorter than the first dummy gate line.

32. The method of claim 23, further comprising:

forming a third dummy active region and a fourth dummy active region extending between edges of the one or more device isolation region openings, the third and fourth dummy active regions each having a linear shape that extends in the first direction, wherein patterning the gate part forming layer comprises forming a second dummy gate line from the gate part forming layer extending in the first direction, the second dummy gate line having a width extending over opposite edges of the third dummy active region and opposite edges of the fourth dummy active region, wherein the second dummy gate line has a length shorter than the first dummy gate line.

* * * * *